(12) United States Patent
Liao et al.

(10) Patent No.: US 11,049,563 B1
(45) Date of Patent: Jun. 29, 2021

(54) MIXED MODE MEMORY CELL

(71) Applicants: JIANGSU ADVANCED MEMORY TECHNOLOGY CO., LTD., Huaian (CN); JIANGSU ADVANCED MEMORY SEMICONDUCTOR CO., LTD., Huaian (CN); ALTO MEMORY TECHNOLOGY CORPORATION, Zhubei (TW)

(72) Inventors: Yu-Cheng Liao, Zhubei (TW); Chun-Chih Liu, Zhubei (TW); Ching-Sung Chiu, Zhubei (TW)

(73) Assignee: JIANGSU ADVANCED MEMORY TECHNOLOGY CO., LTD., Huaian (CN)

( * ) Notice: Subject to any disclaimer, the term of this patent is extended or adjusted under 35 U.S.C. 154(b) by 0 days.

(21) Appl. No.: 16/885,146

(22) Filed: May 27, 2020

(30) Foreign Application Priority Data

Mar. 3, 2020 (CN) .......................... 202010139681.5

(51) Int. Cl.
| | | |
|---|---|---|
| *G11C 11/00* | (2006.01) | |
| *G11C 14/00* | (2006.01) | |
| *G11C 13/00* | (2006.01) | |
| *G11C 11/419* | (2006.01) | |
| *G11C 11/412* | (2006.01) | |

(52) U.S. Cl.
CPC .......... *G11C 14/009* (2013.01); *G11C 11/412* (2013.01); *G11C 11/419* (2013.01); *G11C 13/003* (2013.01); *G11C 13/0004* (2013.01); *G11C 13/004* (2013.01); *G11C 13/0069* (2013.01)

(58) Field of Classification Search
CPC ... G11C 14/009; G11C 11/412; G11C 11/419; G11C 13/0004
USPC ......................................................... 365/148
See application file for complete search history.

(56) References Cited

U.S. PATENT DOCUMENTS

| | | | | |
|---|---|---|---|---|
| 5,602,776 | A * | 2/1997 | Herdt ................. | G11C 14/0063 365/185.08 |
| 9,318,196 | B1 * | 4/2016 | Kasai ................. | G11C 14/0063 |
| 2010/0202191 | A1 * | 8/2010 | Ahn ..................... | G11C 14/0081 365/154 |
| 2011/0280073 | A1 * | 11/2011 | Chiu .................... | G11C 13/0002 365/185.08 |

* cited by examiner

*Primary Examiner* — Vu A Le
(74) *Attorney, Agent, or Firm* — Maschoff Brennan

(57) ABSTRACT

A mixed mode memory cell comprises a reading and writing component group, a storage circuit and a selection circuit. The reading and writing component group is electrically coupled to a word line and two bit lines, wherein the two bit lines respectively transmit two data signals. The storage circuit is electrically coupled to the reading and writing component group. The selection circuit is electrically coupled to the reading and writing component group and the storage circuit, and configured to control the storage circuit to operate in a volatile storage mode or a non-volatile storage mode based on a selection voltage.

8 Claims, 3 Drawing Sheets

MIXED MODE MEMORY CELL

CROSS-REFERENCE TO RELATED APPLICATIONS

This non-provisional application claims priority under 35 U.S.C. § 119(a) on Patent Application No(s). 202010139681.5 filed in China on Mar. 3, 2020, the entire contents of which are hereby incorporated by reference.

BACKGROUND

1. Technical Field

This invention relates to a memory cell, and particularly to a mixed mode memory cell.

2. Related Art

Static random access memories (SRAM) is a kind of random access memories wherein the term "static" means that as long as the power is kept on, the stored data can be constantly maintained. In contrast, the data stored in dynamic random access memories (DRAM) is updated periodically. In comparison with DRAM, SRAM has advantages of high speed, low power consumption, etc. However, in case the power supply is turned off, the data stored in either SRAM or DRAM will disappear, so SRAM and DRAM are called volatile memories.

SUMMARY

Accordingly, this invention provides a mixed mode memory cell that can selectively operate in a volatile storage mode or a non-volatile storage mode through its specific circuit structure.

According to an embodiment of this invention, a mixed mode memory cell comprises a reading and writing component group, a storage circuit and a selection circuit. The reading and writing component group is electrically coupled to a word line and two bit lines, wherein the two bit lines respectively transmit two data signals. The storage circuit is electrically coupled to the reading and writing component group. The selection circuit is electrically coupled to the reading and writing component group and the storage circuit, and configured to control the storage circuit to operate in a volatile storage mode or a non-volatile storage mode based on a selection voltage.

In view of the above, the mixed mode memory cell provided in this invention can be set to operate in a volatile storage mode or a non-volatile storage mode according to requirements, thus having high adaptability. Moreover, a memory formed by the mixed mode memory cells provided in this invention may match a variety of computing devices or other electronic devices with different requirements for a specific storage mode by adjusting the selection voltage corresponding to each memory cell in the memory, without changing the circuit design of the memory, therefore the development cost is reduced.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
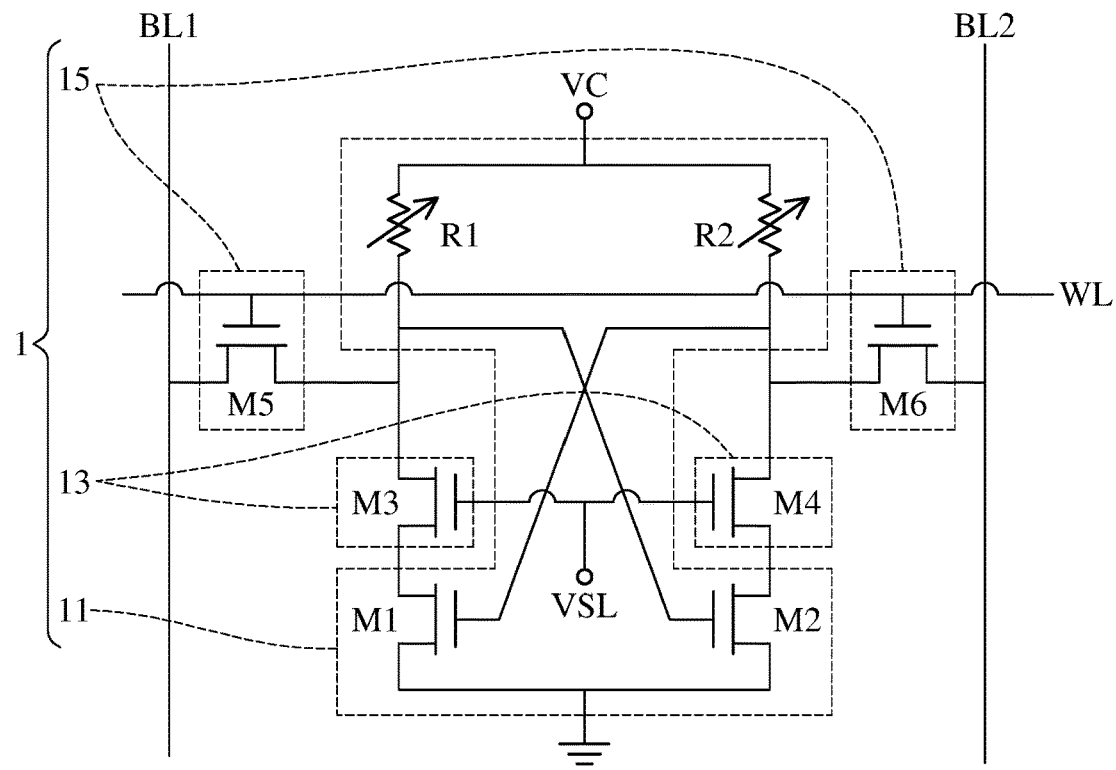
FIG. 1 is a schematic circuit diagram of a mixed mode memory cell according to an embodiment of this invention.

This invention provides a mixed mode memory cell that can operate in multiple storage modes including a volatile storage mode and a non-volatile storage mode. Please refer to FIG. 1 and FIG. 2, wherein FIG. 1 is a schematic circuit diagram of a mixed mode memory cell 1 according to an embodiment of this invention, and FIG. 2 exemplarily illustrates the electrical coupling terminals of the mixed mode memory cell 1.

The mixed mode memory cell 1 comprises a storage circuit 11, a selection circuit 13 and a reading and writing component group 15. The storage circuit 11 can operate in the volatile storage mode or the non-volatile storage mode based on the electrical coupling status among the internal elements. In other words, the storage circuit 11 can temporarily or permanently store data based on the electrical coupling status among the internal elements. The components of the internal elements and the coupling relationship among the internal elements will be described later. In the volatile storage mode, when the electric power supplied to the mixed mode memory cell 1 is turned off, the data stored in storage circuit 11 will disappear; in contrast, in the non-volatile storage mode, when the electric power supplied to the mixed mode memory cell 1 is turned off, the data stored in storage circuit 11 won't disappear. The selection circuit 13 is electrically coupled to the storage circuit 11, and configured to control the aforementioned electrical coupling status among the internal elements of the storage circuit 11 based on a selection voltage VSL so as to control the storage circuit 11 to operate in the volatile storage mode or the non-volatile storage mode. The reading and writing component group 15 is electrically coupled to the storage circuit 11 and the selection circuit 13, and configured to be controlled by a word line WL to transmit two data signals from two bit lines (hereinafter referred to as "first bit line BL1" and "second bit line BL2") to the storage circuit 11, so that the storage circuit 11 can store the data signals from the first and second bit lines BL1 and BL2 under the volatile storage mode or the non-volatile storage mode which is determined by the selection circuit 13 as mentioned above.

The elements included in each circuit are further described in the following. As shown in FIG. 1, the storage circuit 11 comprises two variable resistors (hereinafter referred to as "first variable resistor R1" and "second variable resistor R2") and two transistors (hereinafter referred to as "first transistor M1" and "second transistor M2"), wherein the first and second variable resistors R1 and R2 serve as pull-up elements and the first and second transistors M1 and M2 serve as pull-down elements. More particularly, the first and second variable resistors R1 and R2 can each comprise a phase change element or a resistance change element. As an example, the phase change element can consist of a phase change material (PCM) and a conductive material such as metal, wherein the two materials are located close to each other, such that when a high current passes through the conductive material, the conductive material will heat the phase change material, and the phase of the phase change material is accordingly be adjusted. The resistance of the phase change material in an amorphous state is higher than the resistance of the phase change material in a crystalline state. The resistance change element can be, for example, an element that generally consists of a resistive random access memory (RRAM). Each of the first and second transistors M1 and M2 can be a metal-oxide-semiconductor field-effect transistor (MOSFET), and particularly be an N-type metal-oxide-semiconductor field-effect transistor (NMOSFET).

The selection circuit 13 comprises a third transistor M3 and a fourth transistor M4, wherein the third and fourth transistors M3 and M4 can be metal-oxide-semiconductor field-effect transistors (MOSFET), and are not limited to N-type or P-type MOSFET in this invention. As mentioned above, the selection circuit 13 can control the electrical coupling status among the internal elements of the storage circuit 11 based on the selection voltage VSL. More particularly, the selection circuit 13 can control the electrical coupling status between the first and second variable resistors R1 and R2 and the first and second transistors M1 and M2 of the storage circuit 11 to be conducted or not conducted based on the selection voltage VSL. The reading and writing component group 15 comprises a fifth transistor M5 and a sixth transistor M6 which are controlled by the word line WL to respectively transmit the data signals from the first and second bit lines BL1 and BL2. The fifth and sixth transistors M5 and M6 can be metal-oxide-semiconductor field-effect transistors (MOSFET), and particularly be N-type MOSFET.

Figure 2:
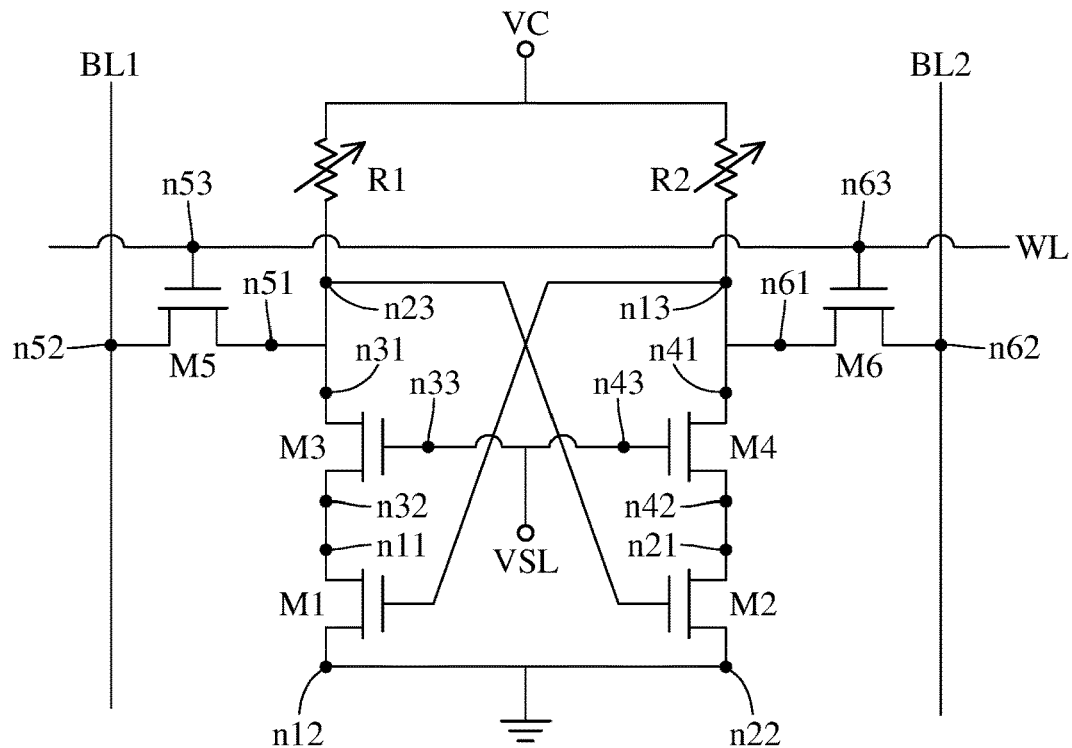
FIG. 2 is a schematic diagram showing electrical coupling terminals of a mixed mode memory cell according to an embodiment of this invention.

As shown in FIG. 1 and FIG. 2, each resistor has two terminals, and each transistor has three terminals. For ease of explanation, in FIG. 2, the three terminals of the first transistor M1 are illustrated as the first terminal n11, the second terminal n12 and the control terminal n13; the three terminals of the second transistor M2 are illustrated as the first terminal n21, the second terminal n22 and the control terminal n23; the three terminals of the third transistor M3 are illustrated as the first terminal n31, the second terminal n32 and the control terminal n33; the three terminals of the fourth transistor M4 are illustrated as the first terminal n41, the second terminal n42 and the control terminal n43; the three terminals of the fifth transistor M5 are illustrated as the first terminal n51, the second terminal n52 and the control terminal n53; and the three terminals of the sixth transistor M6 are illustrated as the first terminal n61, the second terminal n62 and the control terminal n63.

The following further describes the electrical coupling relationship among the internal elements of the storage circuit 11. As shown in FIG. 2, one terminal of the first variable resistor R1 of the storage circuit 11 is configured to receive a control voltage VC and the other terminal of the first variable resistor R1 is electrically coupled to the control terminal n23 of the second transistor M2; one terminal of the second variable resistor R2 is configured to receive the control voltage VC and the other terminal of the second variable resistor R2 is electrically coupled to the control terminal n13 of the first transistor M1. The first variable resistor R1 and the second variable resistor R2 can be respectively and electrically coupled to two voltage sources which separately supply the control voltage VC, or be electrically coupled to a same voltage source which independently supplies the control voltage VC, where it is understood that the coupling configurations of these elements are not limited in this invention. Moreover, the second terminals n12 and n22 of the first and second transistors M1 and M2 are grounded.

The following further describes the electrical coupling relationship between the storage circuit 11 and the selection circuit 13. The first terminal n31 of the third transistor M3 of the selection circuit 13 is electrically coupled to one terminal of the first variable resistor R1 of the storage circuit 11 and the control terminal n23 of the second transistor M2; the second terminal n32 of the third transistor M3 of the selection circuit 13 is coupled to the first terminal n11 of the first transistor M1 of the storage circuit 11; the control terminal n33 of the third transistor M3 of the selection circuit 13 is configured to receive the selection voltage VSL. The coupling relationship between the fourth transistor M4 of the selection circuit 13 and the storage circuit 11 is symmetrical to the coupling relationship between the third transistor M3 of the selection circuit 13 and the storage circuit 11. The first terminal n41 of the fourth transistor M4 of the selection circuit 13 is electrically coupled to one terminal of the second variable resistor R2 of the storage circuit 11 and the control terminal n13 of the first transistor M1; the second terminal n42 of the fourth transistor M4 of the selection circuit 13 is coupled to the first terminal n21 of the second transistor M2 of the storage circuit 11; the control terminal n43 of the fourth transistor M4 of the selection circuit 13 is also configured to receive the selection voltage VSL. The control terminal n33 of the third transistor M3 and the control terminal n43 of the fourth transistor M4 can be respectively and electrically coupled to two voltage sources which separately supply the selection voltage VSL, or be electrically coupled to a same voltage source which independently supplies the selection voltage VSL, where it is understood that the coupling configurations of these elements are not limited in this invention. Said one or two voltage sources can be driven based on the selection of a user, or the mixed mode memory cell 1 can further comprise a microprocessor or a microcontroller to drive said one or two voltage sources to supply the selection voltage VSL based on a preset selection.

With the above coupling relationship, the storage circuit 11 can operate in the volatile storage mode or the non-volatile storage mode based on the selection voltage VSL. When the selection voltage VSL is supplied to make the third and fourth transistors M3 and M4 be conducted, the electrical coupling status between the first and second variable resistors R1 and R2 and the first and second transistors M1 and M2 is conducted so the storage circuit 11 operates in the volatile storage mode; when the selection voltage VSL is supplied to make the third and fourth transistors M3 and M4 not be conducted, the electrical coupling status between the first and second variable resistors R1 and R2 and the first and second transistors M1 and M2 is not conducted so the storage circuit 11 operates in the non-volatile storage mode. The voltage value of the selection voltage VSL used for conducting or not conducting the third and fourth transistors M3 and M4 can be designed by a person having ordinary skill in the art based on the types of the third and fourth transistors M3 and M4, and is not described in detail herein.

The following further describes the electrical coupling relationship between the reading and writing component group 15 and other circuits. As shown in FIG. 2, the first terminal n51 of the fifth transistor M5 of the reading and writing component group 15 is electrically coupled to the first terminal n31 of the third transistor M3 of the selection circuit 13; that is, the first terminal n51 of the fifth transistor M5 is also electrically coupled to the first variable resistor R1 of the storage circuit 11. The second terminal n52 of the fifth transistor M5 is configured to be electrically coupled to the first bit line BL1, and the control terminal n53 of the fifth transistor M5 is configured to be electrically coupled to the word line WL. Symmetrically, the first terminal n61 of the sixth transistor M6 of the reading and writing component group 15 is electrically coupled to the first terminal n41 of the fourth transistor M4 of the selection circuit 13; that is, the first terminal n61 of the sixth transistor M6 is also electrically coupled to the second variable resistor R2 of the storage circuit 11. The second terminal n62 of the sixth transistor M6 is configured to be electrically coupled to the second bit line BL2, and the control terminal n63 of the sixth transistor M6 is configured to be electrically coupled to the word line WL. When the voltage supplied by the word line WL makes the fifth and sixth transistors M5 and M6 be conducted, the fifth transistor M5 can transmit the data signal from the first bit line BL1 and the sixth transistor M6 can transmit the data signal from the second bit line BL2. The voltage value used for conducting the fifth and sixth transistors M5 and M6 can be designed by a person having ordinary skill in the art based on the types of the fifth and sixth transistors M5 and M6, and is not described in detail herein.

Figure 3:
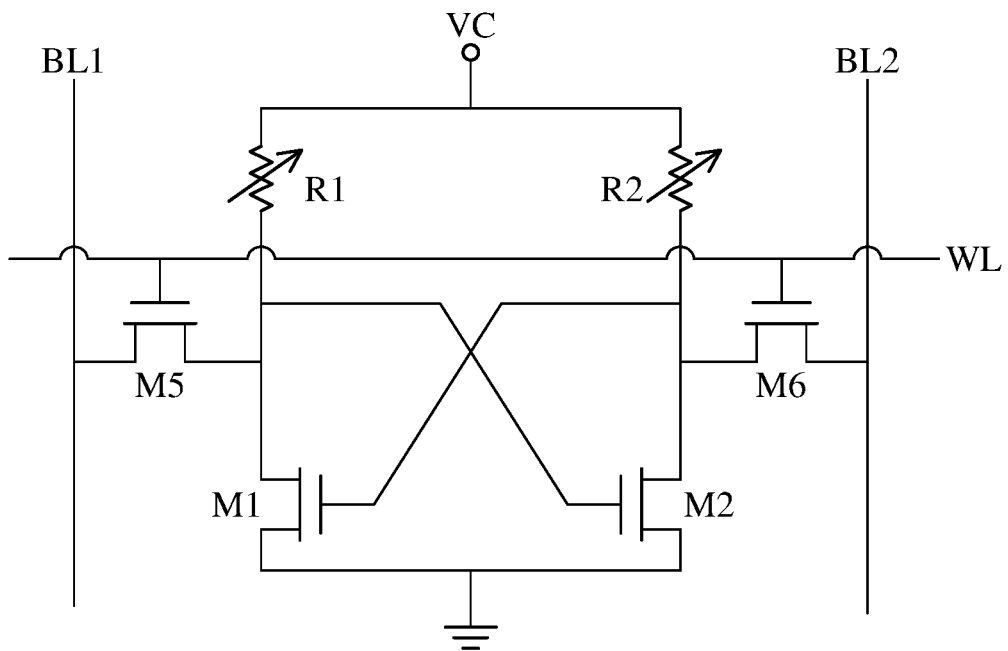
FIG. 3 is an equivalent circuit diagram of a mixed mode memory cell in the volatile storage mode according to an embodiment of this invention.
Figure 4:
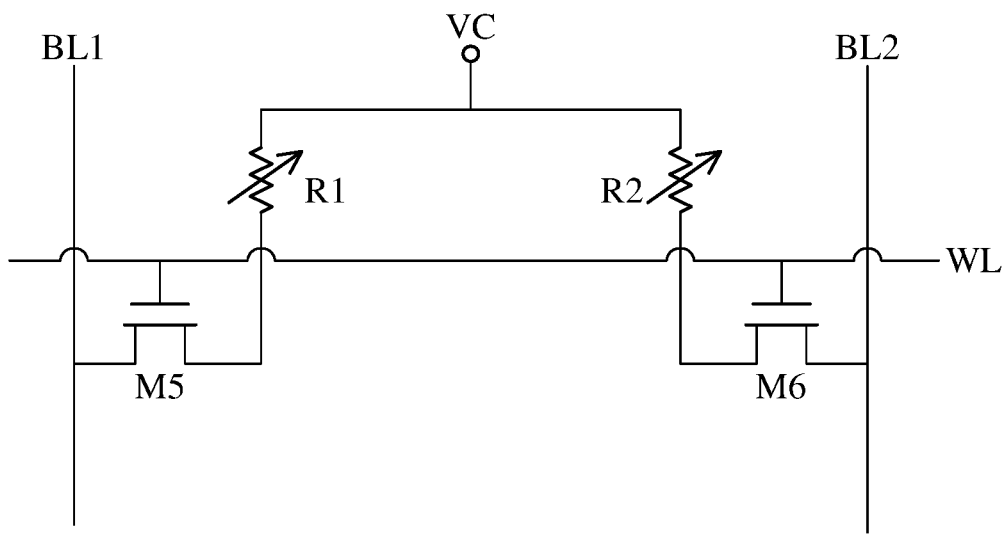
FIG. 4 is an equivalent circuit diagram of a mixed mode memory cell in the non-volatile storage mode according to an embodiment of this invention.

The elements to which the aforementioned fifth and sixth transistors M5 and M6 transmit the data signals are determined based on the selection voltage VSL, and particularly are dependent on whether the third and fourth transistors M3 and M4 are conducted or not. Please refer to FIG. 1, FIG. 3 and FIG. 4, wherein FIG. 3 is an equivalent circuit diagram of the mixed mode memory cell 1 in the volatile storage mode according to an embodiment of this invention and FIG. 4 is an equivalent circuit diagram of the mixed mode memory cell 1 in the non-volatile storage mode according to an embodiment of this invention. In the implementation of the volatile storage mode shown in FIG. 3, the third and fourth transistors M3 and M4 of the selection circuit 13 are conducted based on the selection voltage VSL, so the electrical coupling status between the first and second variable resistors R1 and R2 and the first and second transistors M1 and M2 is in a status where they are electrically coupled with each other via wires. The equivalent circuit shown in FIG. 3 is similar to the circuit of static random access memory (SRAM), which is a volatile memory. In this implementation, the read and write operations of the mixed mode memory cell 1 are similar to those of SRAM, and are not described in detail herein.

In the implementation of the non-volatile storage mode shown in FIG. 4, the third and fourth transistors M3 and M4 are not conducted based on the selection voltage VSL, resulting in that the first and second transistors M1 and M2 are also not conducted. In this implementation, the mixed mode memory cell 1 can use the first and second variable resistors R1 and R2 together to store one bit, or use the first and second variable resistors R1 and R2 to respectively store two bits. More particularly, in the case of being used together for storing one bit, the first and second bit lines BL1 and BL2 can respectively be a complementary bit line (BLB) and a bit line (BL), and the data signals they transmit are a set of complementary signals, including a resetting signal and a setting signal. As mentioned above, the first and second variable resistors R1 and R2 can each comprise a phase change element, which can be in the amorphous state to have a high resistance or in the crystalline state to have a low resistance based on the voltage or current waveforms they carry. For example, the resetting signal can be a voltage or current waveform with a high amplitude and a short duration, and this kind of voltage or current waveforms leads the phase change material to be at the amorphous state and makes the corresponding resistor has a relatively high resistance; on the other hand, the setting signal can be a voltage or current waveform with a lower amplitude and a longer duration when compared to the resetting signal, and this kind of voltage or current waveforms leads the phase change material to be at the crystalline state and makes the corresponding resistor has a relatively low resistance.

In this case, it can be assumed that the condition in which first variable resistor R1 has a relatively low resistance and the second variable resistor R2 has a relatively high resistance indicates bit 0, and the opposite condition indicates bit 1. Accordingly, if it is intended that bit 0 is written into the storage circuit 11, a setting signal is transmitted to the first variable resistor R1 through the first bit line BL1 and a resetting signal is transmitted to the second variable resistor R2 through the second bit line BL2; if it is intended that bit 1 is written into the storage circuit 11, a resetting signal is transmitted to the first variable resistor R1 through the first bit line BL1 and a setting signal is transmitted to the second variable resistor R2 through the second bit line BL2. During the reading phase, a constant voltage is applied to the first and second bit lines BL1 and BL2 and the current values of the two lines are measured, and the bit stored in the first and second variable resistors R1 and R2 is determined according to the relative values between the resistances of the first and second variable resistors R1 and R2 which is determined by comparing the current values of the two lines; or, a constant current is applied to the first and second bit lines BL1 and BL2 and the voltage values of the two lines are measured, and the bit stored in the first and second variable resistors R1 and R2 is determined according to the relative values between the resistances of the first and second variable resistors R1 and R2 which is determined by comparing the voltage values of the two lines.

In the case that the first and second variable resistors R1 and R2 are used to store two bits respectively, the first variable resistor R1 and second variable resistor R2 are two independent storage elements. In this case, it can be assumed that the variable resistor has a relatively low resistance as it stores bit 0, and has a relatively high resistance as it stores bit 1. Transmitting a setting signal to the first variable resistor R1 through the first bit line BL1 can lead the first variable resistor R1 to store bit 0, and transmitting a resetting signal to the first variable resistor R1 through the first bit line BL1 can lead the first variable resistor R1 to store bit 1. The writing operation for the second variable resistor R2 is operated in the same way. During the reading phase, a constant voltage is applied to the first and second bit lines BL1 and BL2 and the current values of the two lines are measured, and each of the first and second variable resistors R1 and R2 is determined to store bit 0 or 1 by comparing its current value with a reference current value; or, a constant current is applied to the first and second bit lines BL1 and BL2 and the voltage values of the two lines are measured, and each of the first and second variable resistors R1 and R2 is determined to store bit 0 or 1 by comparing its voltage value with a reference voltage value.

By the above-mentioned method of using the voltage or current waveforms to program the resistances of the first and second variable resistors R1 and R2, even if the power supply is turned off, the first and second variable resistors R1 and R2 can maintain the state before the power supply is turned off, so that the two resistors can be non-volatile storage elements. In particular, the first and second bit lines BL1 and BL2 can be controlled by a read and write control circuit (not shown). The read and write control circuit can perform the aforementioned operations of providing a writing signal or providing a reading signal, and can also proceed with determination of the stored bit.

Figure 5:
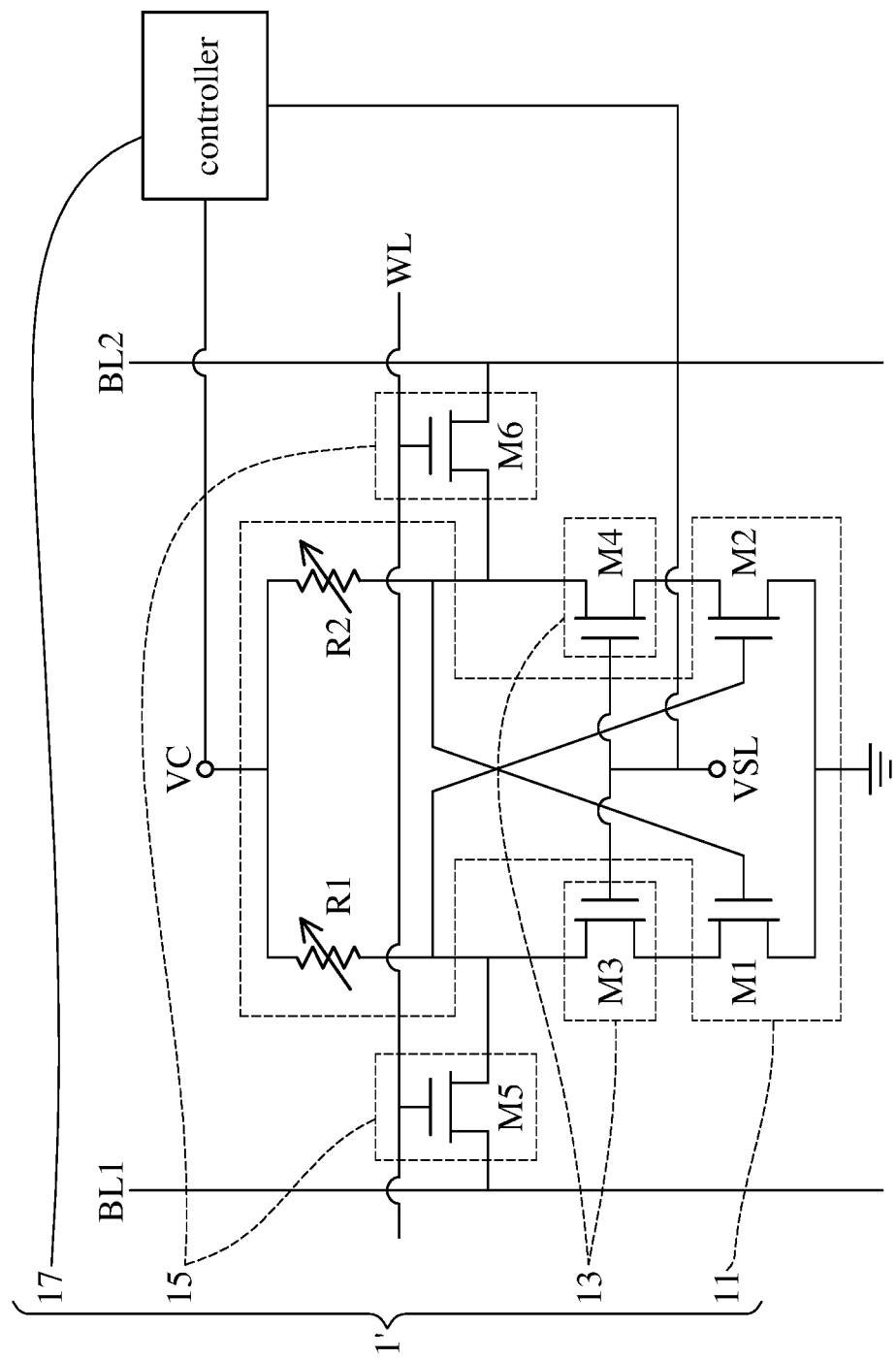
FIG. 5 is a schematic circuit diagram of a mixed mode memory cell according to another embodiment of this invention.

This invention also provides a mixed mode memory cell that comprises a controller in addition to the circuit structure as described in the above embodiments. Please refer to FIG. 1 and FIG. 5, wherein FIG. 5 is a schematic circuit diagram of a mixed mode memory cell 1' according to another embodiment of this invention. As shown in FIG. 1 and FIG. 5, the elements of the mixed mode memory cell 1' and their electrical coupling relationship are the same as the elements of the mixed mode memory cell 1 and their electrical coupling relationship, so the circuits formed by the elements of the mixed mode memory cell 1' and the operations of the circuits are not repeated. In addition to the electronic elements of the mixed mode memory cell 1, the mixed mode memory cell 1' further comprises a controller 17. The controller 17 is electrically coupled to the storage circuit 11 and the selection circuit 13, and configured to detect the selection voltage VSL and to selectively modulate the voltage value of the control voltage VC based on the selection voltage VSL. The controller 17 can be a control circuit that is electrically coupled between the first and second variable resistors R1 and R2 of the storage circuit 11 and the voltage source supplying the control voltage VC, or the controller 17 can be a device that includes the voltage source supplying the control voltage VC, where it is understood that the coupling configurations of these elements are not limited in this invention.

When the selection voltage VSL is supplied to make the third and fourth transistors M3 and M4 of the selection circuit 13 be conducted so as to lead the storage circuit 11 to be in the volatile storage mode, the controller 17 sets the control voltage VC to have a first voltage value; when the selection voltage VSL is supplied to make the third and fourth transistors M3 and M4 of the selection circuit 13 not be conducted so as to lead the storage circuit 11 to be in the non-volatile storage mode, the controller 17 sets the control voltage VC to have a second voltage value. The absolute value of the first voltage value is higher than the absolute value of the second voltage value. For example, when the storage circuit 11 operates in the volatile storage mode, the controller 17 can set the control voltage VC to have a voltage value of working voltage (VDD). When the storage circuit 11 operates in the non-volatile storage mode, the controller 17 can set the control voltage VC to have a voltage value of zero, namely grounding the first and second variable resistors R1 and R2 of the storage circuit 11. On the other hand, when the storage circuit 11 operates in the non-volatile storage mode, the controller 17 can set the control voltage VC to have a voltage value of working voltage (VDD) or other voltage values. In comparison with the embodiment in which the working voltage (VDD) serves as the control voltage VC as the storage circuit 11 operating in the non-volatile storage mode, it may be easier for the embodiment in which the control voltage VC is set to zero as the storage circuit 11 operating in the non-volatile storage mode to design the waveform of writing signals (e.g. the aforementioned resetting signal and setting signal). In other words, in the embodiment in which the control voltage VC is set to zero as the storage circuit 11 operating in the non-volatile storage mode, the waveform design of writing signals is less difficult.

In view of the above, the mixed mode memory cell provided in this invention can be set to the volatile storage mode or the non-volatile storage mode according to requirements, and may has high adaptability. Moreover, a memory formed by the mixed mode memory cells provided in this invention may match a variety of computing devices or other electronic devices with different requirements for the storage mode by modulating the setting of the selection voltage corresponding to each memory cell in the memory, without changing the circuit design of the memory, so that the development cost may be reduced.

What is claimed is:

1. A mixed mode memory cell, comprising:
    a reading and writing component group electrically coupled to a word line and two bit lines, wherein the two bit lines respectively transmit two data signals;
    a storage circuit electrically coupled to the reading and writing component group; and
    a selection circuit electrically coupled to the reading and writing component group and the storage circuit, and configured to control the storage circuit to operate in a volatile storage mode or a non-volatile storage mode based on a selection voltage;
    wherein the storage circuit comprises a first variable resistor, a second variable resistor, a first transistor and a second transistor;
    wherein the selection circuit comprises:
        a third transistor, wherein a first terminal of the third transistor is electrically coupled to one terminal of the first variable resistor, a control terminal of the second transistor and the reading and writing component group, a second terminal of the third transistor is electrically coupled to a first terminal of the first transistor, and a control terminal of the third transistor is configured to receive the selection voltage; and
        a fourth transistor, wherein a first terminal of the fourth transistor is electrically coupled to one terminal of the second variable resistor, a control terminal of the first transistor and the reading and writing component group, a second terminal of the fourth transistor is electrically coupled to a first terminal of the second transistor, and a control terminal of the fourth transistor is configured to receive the selection voltage.

2. The mixed mode memory cell according to claim 1, wherein when the reading and writing component group transmits the two data signals to the storage circuit and the storage circuit operates in the non-volatile storage mode, the first variable resistor and the second variable resistor selectively changes resistances respectively based on the two data signals.

3. The mixed mode memory cell according to claim 2, wherein the selection circuit is configured to control electrical coupling status among the first variable resistor, the second variable resistor, the first transistor and the second transistor based on the selection voltage; when the selection circuit controls the electrical coupling status to be conducted based on the selection voltage, the storage circuit operates in the volatile storage mode, and when the selection circuit controls the electrical coupling status not to be conducted based on the selection voltage, the storage circuit operates in the non-volatile storage mode.

4. The mixed mode memory cell according to claim 2, wherein each of the first and second variable resistors comprises a phase change element or a resistance change element.

5. The mixed mode memory cell according to claim 1, wherein the reading and writing component group comprises:
- a fifth transistor fifth transistor, wherein a first terminal of the fifth transistor is electrically coupled to the first terminal of the third transistor, a second terminal of the fifth transistor is electrically coupled to one of the two bit lines, and a control terminal of the fifth transistor is electrically coupled to the word line;
- a sixth transistor, wherein a first terminal of the sixth transistor is electrically coupled to the first terminal of the fourth transistor, a second terminal of the sixth transistor is electrically coupled to the other of the two bit lines, and a control terminal of the sixth transistor is electrically coupled to the word line.

6. The mixed mode memory cell according to claim 2, wherein one end of the first and second variable resistors is electrically coupled to the reading and writing component group, and the other end of the first and second variable resistors is configured to receive a control voltage.

7. The mixed mode memory cell according to claim 6, wherein the mixed mode memory cell further comprises a controller, and the controller is electrically coupled to the storage circuit and the selection circuit, and configured to detect the selection voltage and to control the control voltage based on the selection voltage.

8. The mixed mode memory cell according to claim 7, wherein controlling the control voltage based on the selection voltage detected by the controller comprises:
- when the selection voltage makes the storage circuit to operate in the volatile storage mode, controlling the control voltage to have a first voltage value; and
- when the selection voltage makes the storage circuit to operate in the non-volatile storage mode, controlling the control voltage to have a second voltage value;
- wherein an absolute value of the first voltage value is higher than an absolute value of the second voltage value.

* * * * *